(12) United States Patent
Choi et al.

(10) Patent No.: US 9,190,566 B2
(45) Date of Patent: Nov. 17, 2015

(54) LIGHT EMITTING DEVICE

(71) Applicant: LG INNOTEK CO., LTD., Seoul (KR)

(72) Inventors: Jae Hoon Choi, Seoul (KR); Young Jae Choi, Seoul (KR); Ho Jun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/496,599

(22) Filed: Sep. 25, 2014

(65) Prior Publication Data

US 2015/0083995 A1  Mar. 26, 2015

(30) Foreign Application Priority Data

Sep. 26, 2013 (KR) .................. 10-2013-0114275

(51) Int. Cl.
*H01L 33/12* (2010.01)
*H01L 33/32* (2010.01)
*H01L 33/00* (2010.01)

(52) U.S. Cl.
CPC ............... *H01L 33/12* (2013.01); *H01L 33/007* (2013.01); *H01L 33/32* (2013.01)

(58) Field of Classification Search
CPC .................. H01L 33/12; H01L 33/32
See application file for complete search history.

(56) References Cited

U.S. PATENT DOCUMENTS

| 2007/0120142 | A1 | 5/2007 | Son |
| 2012/0187540 | A1 | 7/2012 | Hooper et al. |
| 2012/0199810 | A1 | 8/2012 | Lee |
| 2015/0083995 | A1* | 3/2015 | Choi et al. .............. 257/13 |

* cited by examiner

*Primary Examiner* — Mark Prenty
(74) *Attorney, Agent, or Firm* — Birch, Stewart, Kolasch & Birch, LLP

(57) ABSTRACT

Disclosed is a light emitting device package capable of improving luminous efficiency. The light emitting device includes a substrate; a first buffer layer on the substrate; a first insulating layer on the first buffer layer; a second buffer layer on the first insulating layer; a second insulating layer on the second buffer layer; a third buffer layer around the second buffer layer and the insulating layer; and a light emitting structure on the third buffer layer.

20 Claims, 7 Drawing Sheets

LIGHT EMITTING DEVICE

CROSS-REFERENCE TO RELATED APPLICATIONS

This application claims under 35 U.S.C. §119 to Korean Patent Application No. 10-2013-00114275, filed Sep. 26, 2013, which is hereby incorporated by reference.

BACKGROUND

The embodiment relates to a light emitting device, and more particularly, to a light emitting device and a light emitting device package capable of improving luminous efficiency.

Generally, a light emitting device (LED) includes a p-n junction diode having a characteristic of converting electric energy into light energy. The p-n junction diode can be formed by combining group III-V elements of the periodic table. The light emitting device can represent various colors by adjusting the compositional ratio of compound semiconductors.

When a forward voltage is applied to an LED, electrons of an n layer are combined with holes of a p layer, so that energy corresponding to an energy gap between a conduction band and a valance band may be released. This energy is mainly realized as heat or light, and the LED emits the energy as the light. For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

According to the related art, the nitride semiconductor is formed by sequentially laminating an N-type first semiconductor layer, an active layer and a P-type second semiconductor layer on a silicon (Si) substrate.

However, when a GaN semiconductor layer is grown on a silicon substrate, since the substrate and the semiconductor layer have mutually different crystal structures, a lattice mismatch is generated while being spaced apart from an interface or due to a thermal expansion coefficient difference, a stress is generated.

The crystal mismatch and the thermal expansion coefficient difference cause a dislocation and a crack, so that electric and optical characteristics of a light emitting device are deteriorated.

SUMMARY

To solve the above-described problems, an object of the embodiment is to provide a light emitting device and a light emitting device package capable of preventing electric and optical characteristics of a light emitting device from being deteriorated.

To achieve the object, according to the embodiment, there is provided a light emitting device including a substrate; a first buffer layer provided on the substrate in a form of a plurality of patterns; a first insulating layer on the first buffer layer; a second buffer layer on the first insulating layer; a second insulating layer on the second buffer layer; a third buffer layer around the second buffer layer and the second insulating layer; a first conductive semiconductor layer on the third buffer layer; an active layer on the first conductive semiconductor layer; and a second conductive semiconductor layer on the active layer.

According to the embodiment, since the insulating layer is formed between the substrate and the light emitting structure, a dislocation may be prevented from rising.

In addition, according to the embodiment, a lattice mismatch between Si and GaN is reduced, so that a high efficiency GaN film can be grown.

DETAILED DESCRIPTION OF THE EMBODIMENTS

Hereinafter, embodiments will be described in detail with reference to accompanying drawings.

Figure 1:
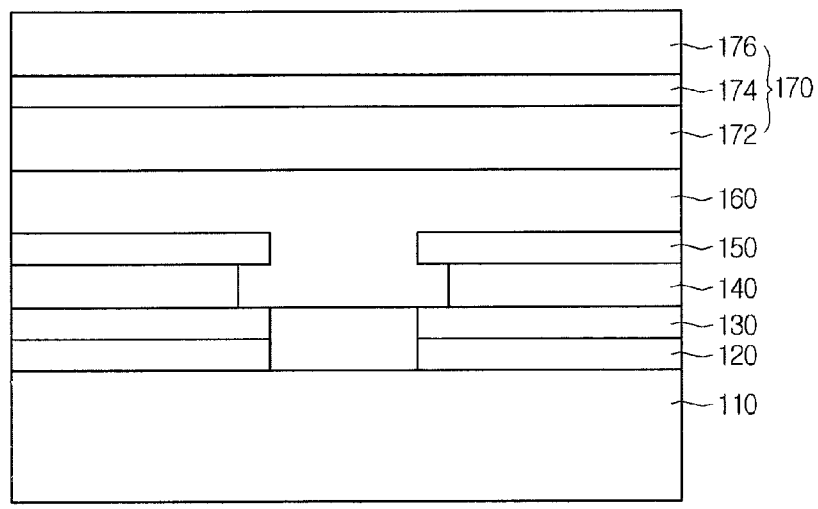
FIG. 1 is a sectional view showing a light emitting device according to the embodiment.
Figure 2:
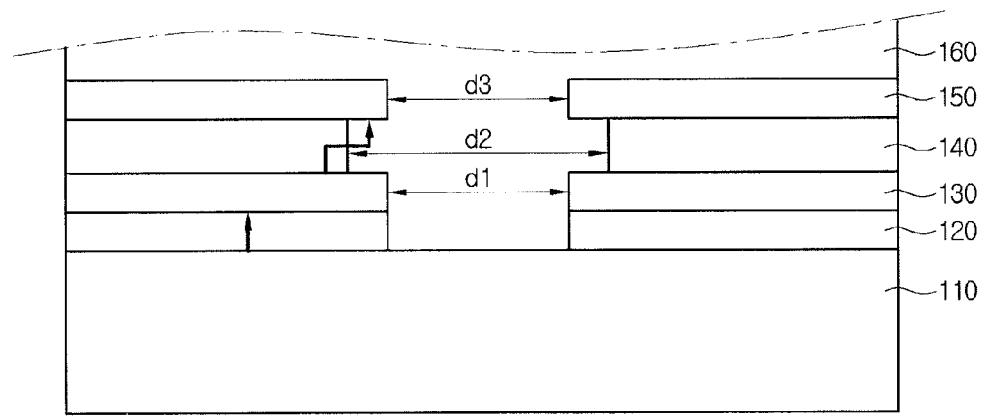
FIG. 2 is a sectional view showing a part of a light emitting device according to the embodiment.

FIG. 1 is a sectional view showing a light emitting device according to the embodiment. FIG. 2 is a sectional view showing a part of a light emitting device according to the embodiment.

Referring to FIGS. 1 and 2, a light emitting device according to the embodiment includes a substrate 110, a first butter layer 120 provided on the substrate 110 with a plurality of patterns, a first insulating layer 130 formed on the first buffer layer 120, a second buffer layer 140 formed on the first insulating layer 130, a second buffer layer 140 formed on the first insulating layer 130, a second insulating layer 150, a third buffer layer 160 disposed around the second buffer layer 140 and the second insulating layer 150, and a light emitting structure 170 including a first conductive semiconductor layer 172 formed on the third buffer layer 160, an active layer 174 formed on the first conductive semiconductor layer 172 and a second conductive semiconductor layer 176 formed on the active layer 174.

The substrate 110 may be formed of a material having superior thermal conductivity and may include a conductive substrate or an insulating substrate. For example, the substrate 110 may include at least one of sapphire ($Al_2O_3$), SiC, Si, GaAs, GaN, ZnO, GaP, InP, Ge, and $Ga_2O_3$. An Si substrate may be used in the embodiment.

The first buffer layer 120 may be formed on the substrate 110.

The first buffer layer 120 reduces the lattice mismatch between materials of the light emitting structure and the substrate 110. The first buffer layer 120 may be formed of group III-V compound semiconductor such as AlN or AlN, $Al_2O_3$. The first buffer layer 120 may be provided on the substrate 110 in the form of a plurality of patterns aligned at a regular interval.

The first insulating layer 130 may be formed on the first buffer layer 120.

The first insulating layer 130 may be adjacent to the entire upper portion of the first buffer layer 120 including the plurality of patterns. A distance d1 between the patterns of the first insulating layer 130 may be equal to that of the patterns of the first buffer layer. Thus, side surfaces of the first insulating layer 130 and the buffer layer 120 may be formed on the same vertical line. The first insulating layer 130 may include SiO$_2$ or SiNx. The first insulating layer 130 may have a thickness in the range of 2,500 Å to 3,500 Å. The first insulating layer 130 may block a dislocation rising from the first buffer layer 120.

The second buffer layer 140 may be formed on the first insulating layer 130.

The second buffer layer 140 may be formed of group II-VI compound semiconductor, or group III-V compound semiconductor, such as ZnO. The second buffer layer 140 may be formed to have a lattice constant greater than that of the first buffer layer 120. The second buffer layer 140 may be formed to be adjacent to a part of an upper portion of the first insulating layer 130 including the patterns. The second buffer layer 140 may be formed to expose an upper edge of the first insulating layer 130. A distance d2 between the patterns of the second buffer layer 140 may be longer than the distance d1 between the patterns of the first insulating layer 130. The second buffer layer 140 may be formed to have a thickness thicker than that of the first insulating layer 130. The second buffer layer 140 may have a thickness in the range of 4,500 Å to 5,500 Å.

When the thickness of the second buffer layer 140 may be less than 4,500 Å, it is difficult to manufacture a power device having high efficiency. When the thickness of the second buffer layer 140 may be equal to or more than 5,500 Å, it is difficult to expect to increase the efficiency anymore, and instead, an entire size of the power device is increased.

The second insulating layer 150 may be formed on the second buffer layer 140.

The second insulating layer 150 may be formed to be adjacent to an entire upper portion of the second buffer layer 140 including the patterns. A distance d3 between the patterns of the second insulating layer 150 may be shorter than the distance d2 of the patterns of the second buffer layer. A side surface of the second insulating layer 150 may be disposed outward of the side surface of the second buffer layer 140. Thus, a lower edge of the second insulating layer 150 may be exposed. The second insulating layer 150 may be implemented by using SiO$_2$ or SiNx. The second insulating layer 150 may have a thickness equal to that of the first insulating layer 130. For example, the second insulating layer 150 may have a thickness in the range of 2,500 Å to 3,500 Å. The side surfaces of the second insulating layer 150 and the first insulating layer 130 may be formed on the same vertical line.

The third buffer layer 160 may be formed on the second insulating layer 150.

The third buffer layer 160 may be formed of group III-V compound semiconductor or group II-VI compound semiconductor such as GaN. The third buffer layer 160 may be formed to have a lattice constant less than that of the second buffer layer 140. The third buffer layer 160 may be formed to cover the second buffer layer 140 and the second insulating layer 150. The lower end of the third buffer layer 160 may be aligned on the same horizontal plane with the lower end of the second buffer layer 140. The third buffer layer 160 may be formed to be adjacent to a side surface of the second buffer layer 140, a lower edge of the second insulating layer 150, a side surface of the second insulating layer 150 and an upper portion of the second insulating layer 150. The third buffer layer 160 may be adjacent to an upper edge of the first insulating layer 130.

Since the third buffer layer 160 is formed to be adjacent to the side surface of the second buffer layer 140, a high efficiency power device is enabled to be manufactured. Since the third buffer layer 160 does not make contact with the Si substrate 110, the dislocation may be blocked from the substrate 110 and the dislocation, which is formed at the adhesion surfaces of the second and third buffer layers 140 and 160, may be blocked by a lower edge of the second insulating layer 150 protruding outward beyond the second buffer layer 140.

As described above, according to the embodiment, the dislocation may be prevented from rising by the first and second insulating layers 130 and 150. In addition, the second and third buffer layers 140 and 160 adhere to each other, so that high efficiency GaN may be grown.

The light emitting structure 170 may be formed on the third buffer layer 160.

The light emitting structure 170 may include a first conductive semiconductor layer 172, an active layer 174, and a second conductive semiconductor layer 176. The active layer 174 may be interposed between the first conductive semiconductor layer 172 and the second conductive semiconductor layer 176. The active layer 174 may be provided on the first conductive semiconductor layer 172, and the second conductive semiconductor layer 176 may be provided on the active layer 174.

The first conductive semiconductor layer 172 may include an N-type semiconductor layer doped with N-type dopants serving as first conductive dopants, and the second conductive semiconductor layer 176 may include a P-type semiconductor layer doped with P-type dopants serving as second conductive dopants. In addition, the first conductive semiconductor layer 172 may include a P-type semiconductor layer, and the second conductive semiconductor layer 176 may include an N-type semiconductor layer.

For example, the first conductive semiconductor layer 172 may include an N-type semiconductor layer. The first conductive semiconductor layer 172 may be implemented by using a compound semiconductor. The first conductive semiconductor layer 172 may be implemented by using group II-VI compound semiconductor, or group III-V compound semiconductor.

For example, the first conductive semiconductor layer 172 may be implemented by using a semiconductor material having a compositional formula of $In_xAl_yGa_{1-x-y}N$ ($0 \le x \le 1$, $0 \le y \le 1$, $0 \le x+y \le 1$). For example, the first conductive semiconductor layer 172 may include one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The active layer 174 emits light having a wavelength corresponding to the energy band gap difference according to materials constituting the active layer 174 through the combination of electrons (or holes) injected through the first conductive semiconductor layer 172 and holes (or electrons) injected through the second conductive semiconductor layer 176. The active layer 174 may have one of a single quantum well (SQW) structure, a multi-quantum well (MQW) structure, a quantum dot structure and a quantum wire structure, but the embodiment is not limited thereto.

The active layer 174 may be implemented by using a compound semiconductor. For example, the active layer 174 may be implemented by using group III-V compound semiconductor. For example, the active layer 174 may be implemented by using a semiconductor material having a compositional formula of $In_xAl_yGa_{1-x-y}N$ ($0 \le x \le 1$, $0 \le y \le 1$, $0 \le x+y \le 1$). When the active layer 174 has an MQW structure, the active layer 174 may be formed by stacking a plurality of well layers and a plurality of barrier layers. For example, the active layer 174 may have a cycle of InGaN well layer/GaN barrier layer.

For example, the second conductive semiconductor layer 176 may include a P-type semiconductor layer. The second conductive semiconductor layer 176 may be implemented by using a compound semiconductor. For example, the second conductive semiconductor layer 176 may be implemented by using group II-VI compound semiconductor, or group III-V compound semiconductor.

For example, the second conductive semiconductor layer 176 may be implemented by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 176 may include one selected from the group consisting of GaN, AlN, AlGaN, InGaN, InN, InAlGaN, AlInN, AlGaAs, GaP, GaAs, GaAsP, and AlGaInP doped with P-type dopants such as Mg, Zn, Ca, Sr, and Ba.

Meanwhile, the first conductive semiconductor layer 172 may include a P-type semiconductor layer and the second conductive semiconductor layer 176 may include the N-type semiconductor layer. In addition, a semiconductor layer including an N-type or P-type semiconductor layer may be additionally provided under the second conductive semiconductor layer 176. Accordingly, the light emitting structure 170 may have at least one of an NP junction structure, a PN junction structure, an NPN junction structure and a PNP junction structure.

Impurities may be doped into the first conductive semiconductor layer 172 and the second conductive semiconductor layer 176 with uniform or non-uniform doping concentration. In other words, the light emitting structure 170 may have various structures, but the embodiment is not limited thereto.

In addition, a first conductive InGaN/GaN superlattice structure or InGaN/InGaN superlattice structure may be formed between the first conductive semiconductor layer 172 and the active layer 174. In addition, a second conductive AlGaN layer may be formed between the second conductive semiconductor layer 176 and the active layer 174.

Hereinafter, a process of manufacturing a light emitting device according to the embodiment will be described wither reference to FIGS. 3 to 10. FIGS. 3 to 10 are sectional view illustrating a method of manufacturing a light emitting device according to the embodiment.

Figure 3:
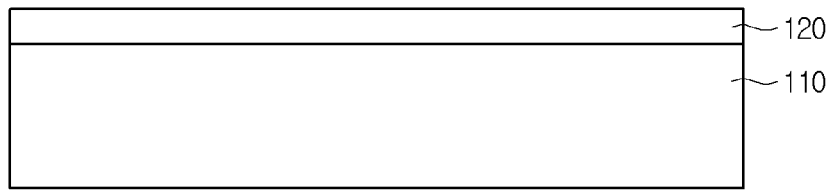
FIGS. 3 to 10 are sectional views illustrating a method of manufacturing a light emitting device according to the embodiment.

As shown in FIG. 3, when a silicon substrate 110 is prepared, a step of forming the first buffer layer 120 on one surface of the substrate 110 is performed.

The first buffer 120 may be provided on the substrate 110 by depositing AlN on the substrate 110 at a predetermined thickness through an MOCVD (Metal Organic Chemical Vapor Deposition) scheme. As well as AlN, $Al_2O_3$ may be used for the first buffer layer 120. The first buffer layer 120 may be formed through a CVD (Chemical Vapor Deposition) scheme, an MBE (Molecular beam epitaxy) scheme or a sputtering scheme, as well as the MOCVD scheme.

Figure 4:
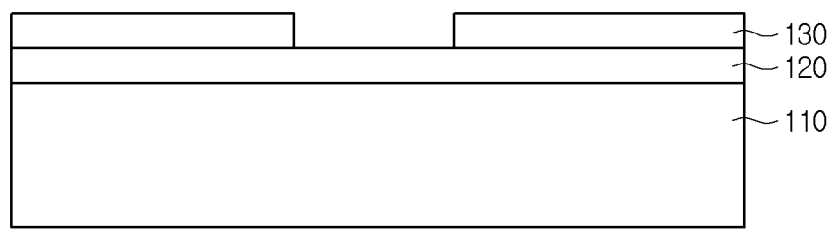

As shown in FIG. 4, when the first buffer layer 120 is formed on the substrate 110, $SiO_2$ is deposited on the first buffer layer 120 such that a step of forming the first insulating layer 130 is performed. The first insulating layer 130 may be formed on the first buffer layer 120 through an MOCVD, CVD, MBE or sputtering scheme. The first insulating layer 130 may be formed to have a thickness in the range of 2,500 Å to 3,500 Å. After the first insulating layer 130 is formed on the first buffer layer 120, a plurality of patterns may be formed through a patterning scheme.

Figure 5:
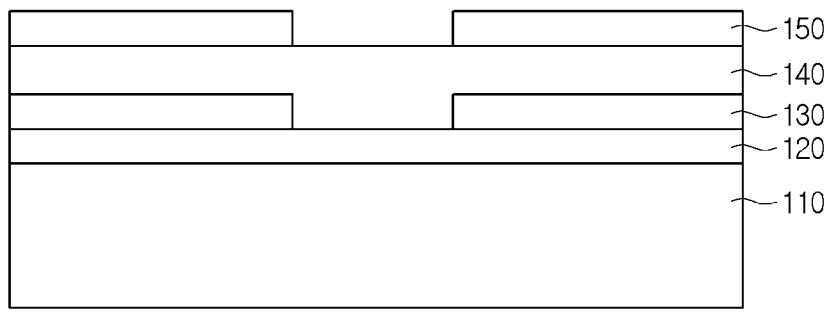

As shown in FIG. 5, when the first insulating layer 130 having a plurality of patterns is provided on the first buffer layer 120, a step of forming the second buffer layer 140 and the second insulating layer 150 on the first insulating layer 130 is performed.

The second buffer layer 140 may be formed by depositing ZnO on the first insulating layer 130. The second buffer layer 140 may be formed through an MOCVD, CVD, MBE or sputtering scheme. The second buffer layer 140 may be formed to cover an upper portion of the first buffer layer 120 and a side surface and an upper portion of the first insulating layer 130. The second buffer layer 140 may have a thickness in the range of 4,500 Å to 5,500 Å.

The second insulating layer 150 may be formed by depositing SiN on the second buffer layer 140. The second insulating layer 150 may be formed on the second buffer layer 140 through an MOCVD, CVD, MBE or sputtering scheme. The second insulating layer 150 may have a thickness in the range of 2,500 Å to 3,500 Å. After the second insulating layer 150 is formed on the second buffer layer 140, the second insulating layer 150 may be patterned to have a plurality of patterns.

Figure 6:
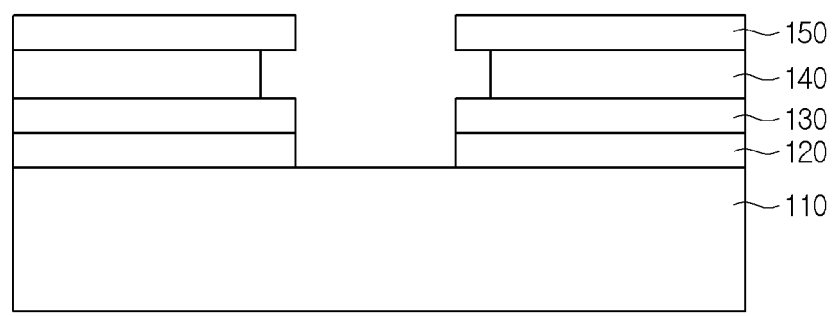

As shown in FIG. 6, when the second insulating layer 150 is formed on the second buffer layer 140, a step of etching the first and second buffer layers 120 and 140.

The second buffer layer 140 may be etched by using etching gas such as $H_2$. The second buffer layer 140 may be etched until the side surface of the second insulating layer 140 is located inwardly of the side surface of the second insulating layer 150. Then, a step of etching the first buffer layer 120 by using the etching gas may be performed to expose an upper portion of the substrate 110.

Figure 7:
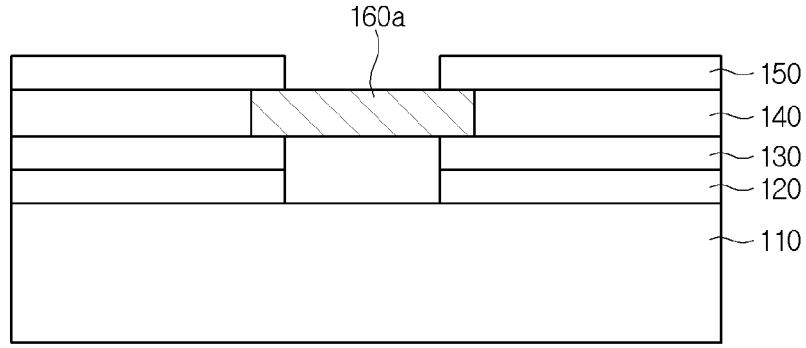

As shown in FIG. 7, when the etching of the first and second buffer layers 120 and 140 is completed, a step of forming the third buffer layer 160 may be performed.

Figure 8:
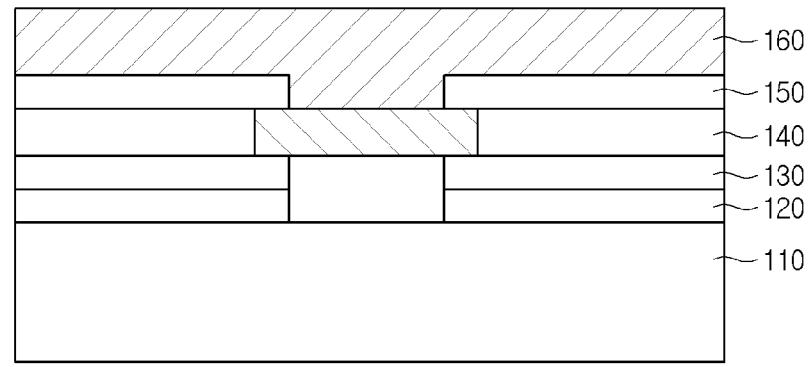

First, after the third buffer layer 160 is disposed at the side surface by horizontally growing GaN on the second buffer layer 140, as shown in FIG. 8, GaN is merged through an Elog (Epitaxial Lateral Overgrowth of Gallium Nitride) scheme such that the third buffer layer 160 may cover the entire second insulating layer.

Figure 9:
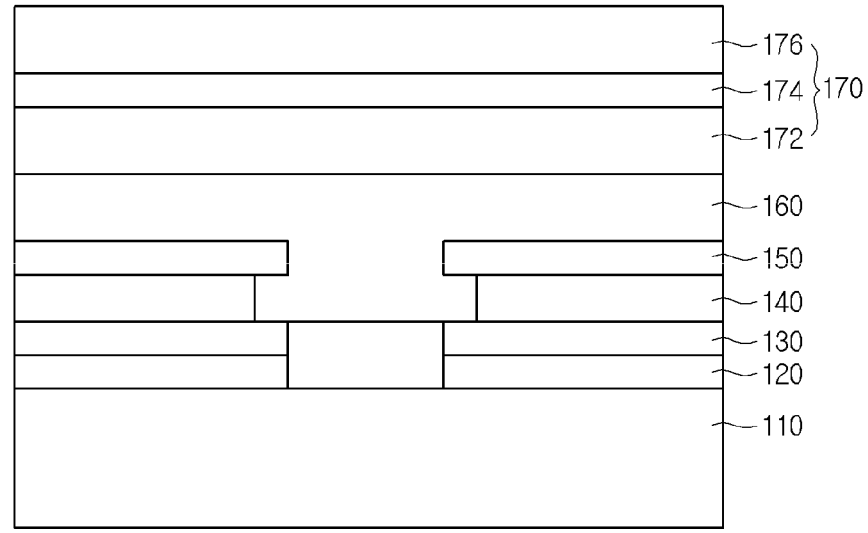

As shown in FIG. 9, when the third buffer layer 160 is formed on the second insulating layer 150, a step of forming the light emitting structure 170 on the third buffer layer 160 may be performed.

The first conductive semiconductor layer 172 may be formed by depositing GaN through an MOCVD scheme. In addition, The first conductive semiconductor layer 172 may be formed by depositing group III-V compound or group II-VI compound.

In addition, the first conductive semiconductor layer 172 may be formed by introducing trimethyl gallium gas (TMGa), ammonia gas ($NH_3$), nitrogen gas ($N_2$), and silane gas ($SiH_4$) including N type dopants such as silicon (Si) into a chamber.

For example, the active layer 174 may be grown by forming the well layer including GaN or InGaN and the barrier layer including GaN, AlGaN, InGaN or InAlGaN by selectively supplying $H_2$ and/or TMGa (or TEGa), TMIn, and TMAl as the source at the predetermined growing temperature in the range of 700° C. to 950° C.

The second conductive type semiconductor layer 176 may be formed by injecting biscetyl cyclo pentadienyl magnesium (($EtCp_2Mg$){$Mg(C_2H_5C_5H_4)_2$}) on the active layer 174, so that second conductive type semiconductor layer 176 may be a P-type GaN layer.

Figure 10:
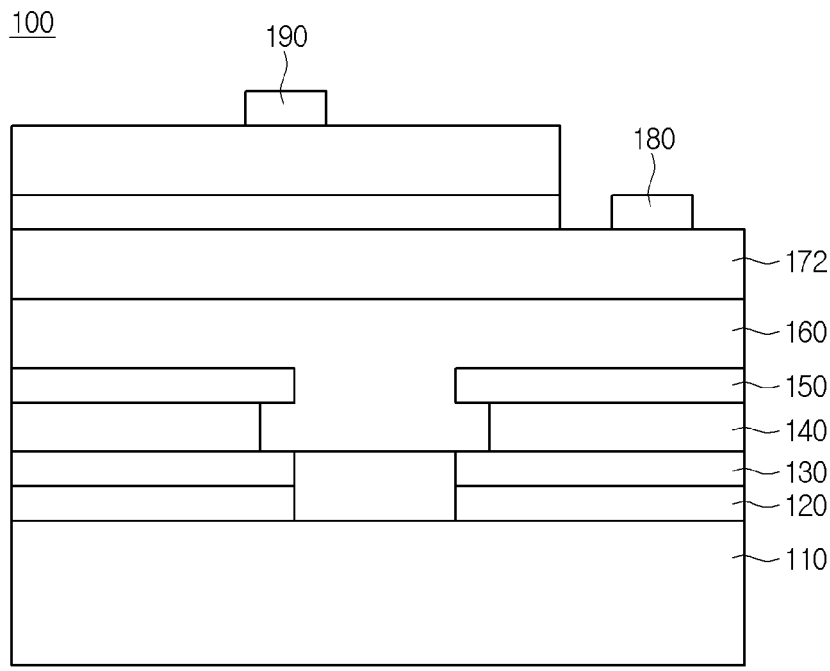

As shown in FIG. 10, when the forming of the first conductive semiconductor layer 172, the active layer 174 and the second conductive semiconductor layer 176 is completed, a mesa etching process may be performed to expose a part of the first conductive semiconductor layer 172.

When a part of an upper portion of the first conductive semiconductor layer 172 is exposed, the first electrode 180 is formed on the first conductive semiconductor layer 172 and the second electrode 190 is formed on the second conductive semiconductor layer 176, so that the process of manufacturing the light emitting device according to the embodiment may be completed.

Figure 11:
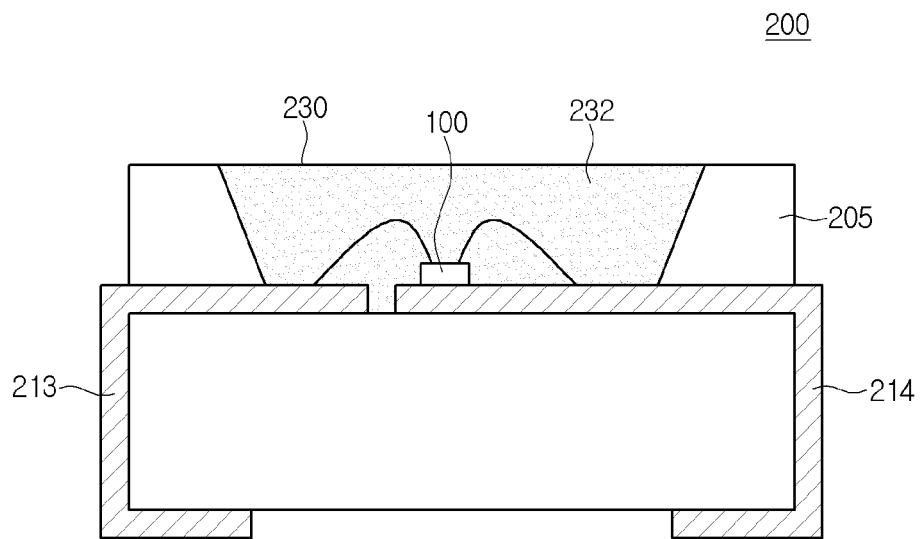
FIG. 11 is a sectional view showing a light emitting device package according to the embodiment.

FIG. 11 is a sectional view showing a light emitting device package according to the embodiment. In FIG. 11, reference number '100' is used to represent the light emitting device.

As shown in FIG. 11, the light emitting device package 200 includes a package body 205, the third and fourth electrode layers 213 and 214 disposed on the package body 205, a light emitting device disposed on the package body 205 and electrically connected to the third and fourth electrode layers 213 and 214, and a molding member 230 surrounding the light emitting device 100.

The package body 205 may include a silicon material, a synthetic resin material or a metallic material. An inclined surface may be formed around the light emitting device chip 100.

The third and fourth electrode layers 213 and 214 are electrically separated from each other, and perform a function of supplying electric power to the light emitting device 100. In addition, the third and fourth electrode layers 213 and 214 reflect the light generated from the light emitting device 100 so that the light efficiency may be improved, and may dissipate the heat generated from the light emitting device 100 to an outside.

The light emitting device 100 may be disposed on the package body 205, or may be disposed on the third or fourth electrode layer 213 or 214.

The light emitting device 100 may be electrically connected to the third and/or fourth electrode layer 213 and/or 214 through one of a wire scheme, a flip-chip scheme and a die bonding scheme. Although it is described in the embodiment that the light emitting device 100 is electrically connected to the third and fourth electrode layers 213 and 214 through wires, respectively, the embodiment is not limited thereto.

The molding member 230 may surround the light emitting device 100 to protect the light emitting device 100. The phosphor 232 is included in the molding member 230, so that the wavelength of light emitted from the light emitting device 100 may be changed.

Figure 12:
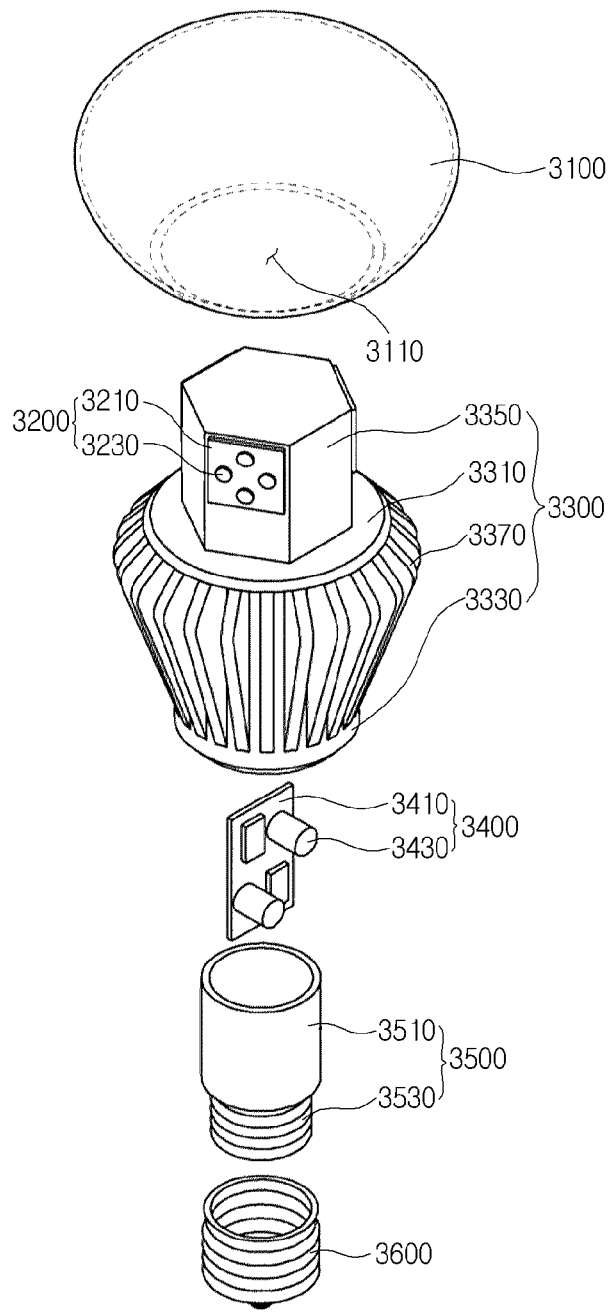
FIGS. 12 to 14 are exploded perspective views showing examples of a lighting system including a light emitting device according to the embodiment.
Figure 13:
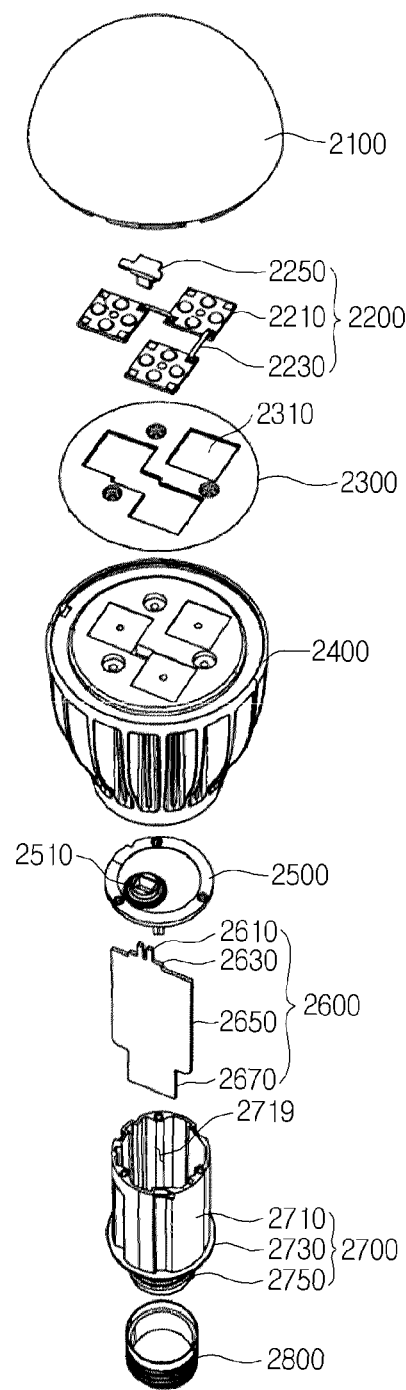
Figure 14:
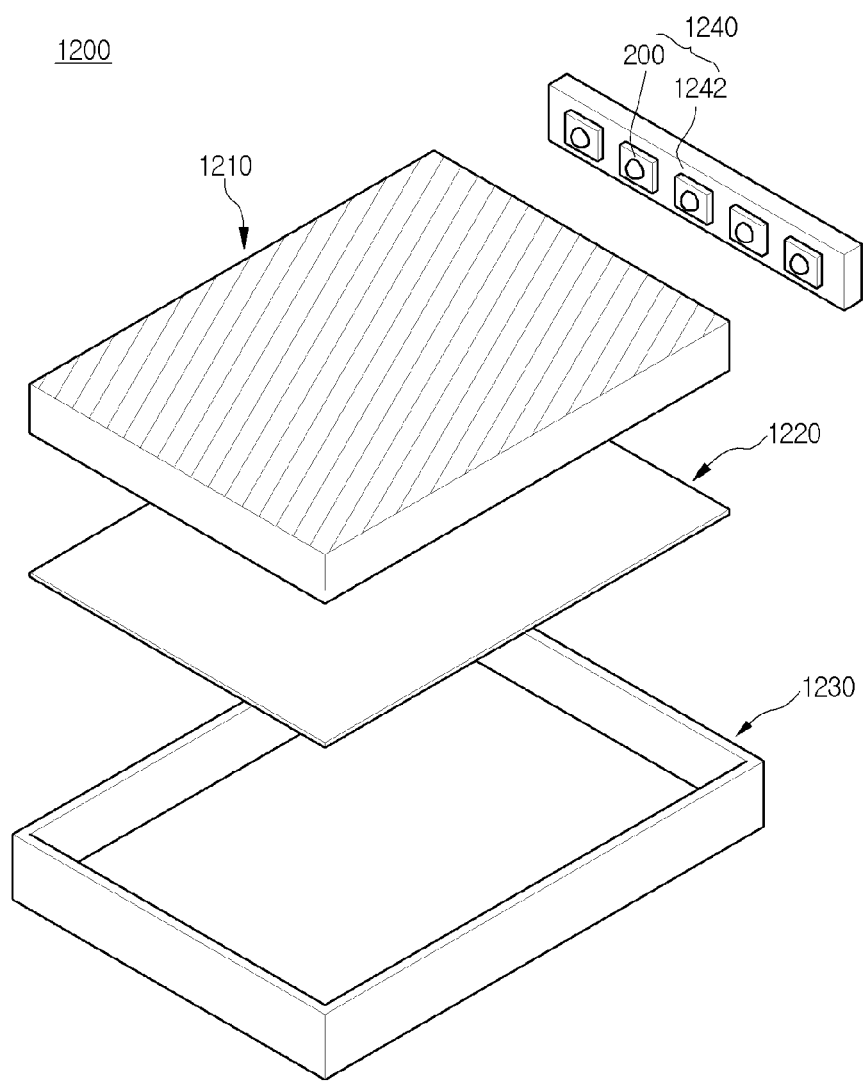

FIGS. 12 to 14 are exploded perspective views showing examples of a lighting system including a light emitting device according to the embodiment.

As shown in FIG. 12, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device package 200 according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion 2610 of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

As shown in FIG. 13, the lighting system according to the embodiment may include a cover 3100, a light source part 3200, a radiator 3300, a circuit part 3400, an inner case 3500, and a socket 3600. The light source part 3200 may include the light emitting device or the light emitting device module according to the embodiment.

The cover 3100 may have a blub shape and is hollow. The cover 3100 has an opening 3110. The light source part 3200 and a member 3350 may be inserted through the opening 3110.

The cover 3100 may be coupled with the radiator 3300, and may surround the light source part 3200 and the member 3350. The light source part 3200 and the member 3350 may be blocked from the outside by the coupling between the cover 3100 and the radiator 3300. The cover 3100 may be coupled with the radiator 3300 by an adhesive or various schemes such as a rotation coupling scheme and a hook coupling scheme. The rotation coupling scheme is a scheme where a thread of the cover 3100 is coupled with a screw groove of the radiator 3300, and the cover 3100 is coupled with the radiator 3300 by rotation of the cover 3100. The hook coupling scheme is a scheme where a projection of the cover 3100 is inserted into a groove of the radiator 3300 so that the cover 3100 is coupled with the radiator 3300.

The cover 3100 may be optically coupled with the light source part 3200. In detail, the cover 3100 may diffuse, scatter, or excite light provided from a light emitting device 3230 of the light source part 3200. The cover 3100 may be a type of optical member. The cover 3100 may be provided at an inner/outer surface or an inside thereof with a luminescence material in order to excite the light supplied from the light source part 3200.

The cover 3100 may include an inner surface coated with a milk-white paint. The milk-white paint may include a diffusion material to diffuse light. The cover 3100 may have the inner surface of which surface roughness is greater than that of the outer surface thereof. The surface roughness is provided for the purpose of sufficiently scattering and diffusing the light from the light source part 3200.

A material of the cover 3100 may include glass, plastic, polypropylene (PP), polyethylene (PE), and polycarbonate (PC). The polycarbonate (PC) has the superior light resistance, heat resistance and strength among the above materials. The cover 3100 may be transparent so that a user may view the light source module 2200 from the outside, or opaque. The cover 3100 may be formed through a blow molding scheme.

The light source part 3200 is disposed at the member 3350 of the radiator 3300, and a plurality of light source parts may be disposed. In detail, the light source part 3200 may be disposed in at least one of a plurality of side surfaces of the member 3350. A top end of the light source part 3200 of the light source part 3200 may be disposed at the side surface of the member 3350.

The light source part 3200 may be disposed at three of six side surfaces of the member 3350. However, the embodiment is not limited thereto, and the light source part 3200 may be disposed at all side surfaces of the member 3350. The light source part 3200 may include a substrate 3210 and a light emitting device 3230. The light emitting device 3230 may be disposed on one surface of the substrate 3210.

The substrate 3210 has a rectangular shape, but the embodiment is not limited thereto. The substrate 3210 may have various shapes. For example, the substrate 3210 may have a circular shape or a polygonal shape. The substrate 3210 may be provided by printing a circuit pattern on an insulator. For example, the typical printed circuit board (PCB) may include a metal core PCB, a flexible PCB, and a ceramic PCB. In addition, the substrate may have a COB (chips on board) type in which LED chips, which are not packaged, are directly bonded on the PCB. In addition, the substrate 3210 may include a material to effectively reflect light, or the surface of the substrate may have a color such as a gold color or a silver color to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other through the radiator 3300.

The light emitting device 3230 may include a light emitting diode chip to emit red, green, and blue lights or a light emitting diode chip to emit UV. The light emitting diode may have the lateral type or the vertical type. The light emitting diode may emit one of blue, red, yellow, and green lights.

The light emitting device 3230 may include a luminescence material. The luminescence material may include at least one of garnet-based phosphors (YAG or TAG), silicate-based phosphors, nitride-based phosphors, and oxynitride-based phosphors. The luminescence material may include at least one of a red luminescence material, a yellow luminescence material and a green luminescence material.

The radiator 3300 is coupled with the cover 3100, and may radiate heat from the light source part 3200. The radiator 330 has a predetermined volume, and includes a top surface 3310 and a side surface 3330. The member 3350 may be disposed on the top surface 3310 of the radiator 3310. The top surface 3310 of the radiator 3300 may be coupled with the cover 3100. The top surface 3310 of the radiator 3300 may have a shape corresponding to an opening 3110 of the cover 3100.

A plurality of heat radiation pins 3370 may be disposed at the side surface 3330 of the radiator 3300. The heat radiation pin 3370 may extend outward from the side surface 3330 of the radiator 3300 or may be connected to the side surface 3330 of the radiator 3300. The heat radiation pin 3370 may improve heat radiation efficiency by increasing a heat radiation area of the radiator 3300. The side surface 3330 may not include the heat radiation pin 3370.

The member 3350 may be disposed on the top surface of the radiator 3300. The member 3350 may be integrated with or coupled to the top surface 3310 of the radiator 3300. The member 3350 may have the shape of a polygonal prism. In detail, the member 3350 may have the shape of a hexagonal prism. The member 3350 having the shape of a hexagonal prism includes a top surface, a bottom surface, and six side surfaces. The member 3350 may have the shape of a circular prism or the shape of an elliptical prism as well as the shape of a hexagonal prism. When the member 3350 has the shape of a circular prism or the shape of an elliptical prism, the substrate 3210 of the light source part 3200 may be a flexible substrate.

The light source part 3200 may be disposed at six side surfaces of the member 3350. The light source part 3200 may be disposed at all or some of the six side surfaces of the member 3350. The light source part 3200 is disposed at three of the six side surfaces of the member 3350.

The substrate 3210 is disposed at the side surface of the member 3350. The side surface of the member 3350 may be substantially vertical to the top surface 3310 of the radiator 3300. Accordingly, the substrate 3210 and the top surface of the radiator 3300 may be substantially vertical to each other.

The member 3350 may include a material representing thermal conductivity. Thus, heat from the light source part 3200 can be rapidly transferred to the member 3350. For example, the material for the member 3350 may include an alloy of metals such as aluminum (Al), nickel (Ni), copper (Cu), magnesium (Mg), silver (Ag), or tin (Sn). The member 3350 may include a plastic material having thermal conductivity. The plastic material having thermal conductivity is lighter than the metal and has thermal conductivity in a single direction.

The circuit part 3400 receives power from the outside, and converts the received power suitably for the light source part 3200. The circuit part 3400 provides the converted power to the light source part 3200. The circuit part 3400 may be disposed at the radiator 3300. In detail, the circuit part 3400 may be received in the inner case 3500, and may be received in the radiator 3300 together with the inner case 3500. The circuit part 3400 may include a circuit board 3410 and a plurality of components mounted on the circuit board 3410.

The circuit board 3410 has a circular shape, but the embodiment is not limited thereto. That is, the circuit board 3410 may have various shapes. For example, the circuit board may have an elliptical shape or a polygonal shape. The circuit board 3410 may be provided by printing a circuit pattern on an insulator.

The circuit board 3410 is electrically connected to the substrate 3210 of the light source part 3200. For example, the circuit part 3410 and the substrate 3210 may be connected to each other by a wire. The wire may be disposed inside the radiator 3300 to connect the substrate 3210 to the circuit board 3410.

For example, a plurality of components 3430 may include a direct current converter converting AC power provided from an external power supply into DC power, a driving chip controlling driving of the light source part 3200, and an electrostatic discharge (ESD) protective device.

The inner case 3500 receives the circuit part 3400 therein. The inner case 3500 may include a receiving part 3510 to receive the circuit part 3400.

For example, the receiving part 3510 may have a cylindrical shape. The shape of the receiving part 3510 may be changed according to the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled with the socket 3600. The inner case 3500 may include a connecting part 3530 coupled with the socket 3600. The connecting part 3530 may have a thread structure corresponding to a screw groove structure of the socket 3600. The inner case 3500 is an insulator. Accordingly, the inner case 3500 prevents electric short between the circuit part 3400 and the radiator 3300. For example, the inner case 3500 may include a plastic or resin material.

The socket 3600 may be coupled with the inner case 3500. In detail, the socket 3600 may be coupled with the connecting part 3530 of the inner case 3500. The socket 3600 may have the same structure as that of a conventional incandescent light bulb. The socket 3600 is electrically connected to the circuit part 3400. For example, the circuit part 3400 and the socket 3600 may be connected to each other by a wire. If external power is applied to the socket 3600, the external power may be transferred to the circuit part 3400. The socket 3600 may have a screw groove structure corresponding to a thread structure of the connecting part 3550.

Further, as shown in FIG. 14, the lighting system according to the embodiment, for example, a backlight unit includes a light guide plate 1210, a light emitting module 1240 for providing the light to the light guide plate 1210, a reflective member 1220 positioned below the light guide plate 1210, and a bottom cover 1230 for receiving the light guide plate 1210, the light emitting module 1240, and the reflective member 1220 therein, but the embodiment is not limited thereto.

The light guide plate 1210 diffuses the light to provide surface light. The light guide plate 1210 includes transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to at least one side surface of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB) as well as a typical PCB, but the embodiment is not limited thereto.

In addition, the light emitting device packages 200 are arranged on the substrate 1242 such that light exit surfaces of the light emitting device packages 200 are spaced apart from the light guide plate 1210 by a predetermined distance.

The reflective member 1220 may be disposed below the light guide plate 1210. The reflective member 1220 reflects the light, which is traveled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 may be manufactured through a press process or an extrusion process by using metallic material or resin material.

Although the exemplary embodiments of the disclosure have been described, it is understood that the disclosure should not be limited to these exemplary embodiments but various changes and modifications can be made by one ordinary skilled in the art within the spirit and scope of the disclosure as hereinafter claimed.

What is claimed is:

1. A light emitting device comprising:
   a substrate;
   a first buffer layer on the substrate;
   a first insulating layer on the first buffer layer;
   a second buffer layer on the first insulating layer;
   a second insulating layer on the second buffer layer;
   a third buffer layer around the second buffer layer and the second insulating layer; and
   a light emitting structure on the third buffer layer.

2. The light emitting device of claim 1, wherein a side surface of the second buffer layer is disposed inwardly of side surfaces of the first and second insulating layers to expose a lower edge of the second insulating layer and an upper edge of the first insulating layer.

3. The light emitting device of claim 2, wherein the side surfaces of the first and second insulating layers are disposed on a same vertical line.

4. The light emitting device of claim 3, wherein the third buffer layer extends horizontally to cover a lower edge of the second insulating layer and an upper edge of the first insulating layer.

5. The light emitting device of claim 1, wherein a thickness of the second buffer layer is thicker than thicknesses of the first and second insulating layers.

6. The light emitting device of claim 5, wherein the thickness of the second buffer layer is in a range of 4,500 Å to 5,500 Å.

7. The light emitting device of claim 1, wherein a lattice constant of the third buffer layer is less than a lattice constant of the second buffer layer.

8. The light emitting device of claim 1, wherein the first to third buffer layers include a group III-V compound semiconductor or a group II-VI compound semiconductor.

9. The light emitting device of claim 8, wherein the first buffer layer includes AlN or $Al_2O_3$.

10. The light emitting device of claim 8, wherein the second buffer layer includes ZnO.

11. The light emitting device of claim 8, wherein the third buffer layer includes GaN.

12. The light emitting device of claim 1, wherein the first and second insulating layers include $SiO_2$ or SiNx.

13. The light emitting device of claim 1, wherein the third buffer layer does not make contact with the substrate.

14. The light emitting device of claim 1, wherein the light emitting structure includes a first conductive semiconductor layer, an active layer on the first conductive semiconductor layer, and a second conductive semiconductor layer on the active layer.

15. A light emitting device comprising:
   a substrate;
   a first buffer layer provided on the substrate in a form of a plurality of patterns;
   a first insulating layer on the patterns of the first buffer layer;
   a second buffer layer on a pattern of the first insulating layer;
   a second insulating layer on a pattern of the second buffer layer;
   a third buffer layer around the patterns of the second buffer layer and the second insulating layer; and
   a light emitting structure on the third buffer layer,
   wherein a distance between the patterns of the second buffer layer is longer than a distance between the patterns of the second insulating layer.

16. The light emitting device of claim 15, wherein a side surface of the second buffer layer is disposed inwardly of a side surface of the second insulating layer.

17. The light emitting device of claim 15, wherein the third buffer layer is aligned to cover a lower edge of the second insulating layer.

18. The light emitting device of claim 15, wherein the third buffer layer is aligned to cover an upper edge of the first insulating layer.

19. The light emitting device of claim 18, wherein a lower region of the third buffer layer is disposed horizontally with the first insulating layer.

20. The light emitting device of claim 15, wherein a thickness of the second buffer layer is thicker than thicknesses of the first and second insulating layers.

* * * * *